United States Patent [19]
Koizumi

[11] Patent Number: 5,315,157
[45] Date of Patent: May 24, 1994

[54] SEMICONDUCTOR INTEGRATED CIRCUIT DEVICE HAVING VOLTAGE LEVEL CONVERTING CIRCUITS

[75] Inventor: Yuuji Koizumi, Tokyo, Japan
[73] Assignee: NEC Corporation, Tokyo, Japan
[21] Appl. No.: 978,933
[22] Filed: Nov. 20, 1992
[30] Foreign Application Priority Data
Nov. 20, 1991 [JP] Japan .................................. 3-303667
[51] Int. Cl.[5] .................................................. H01L 23/48
[52] U.S. Cl. ................................ 257/734; 257/750; 257/773; 257/776; 257/401
[58] Field of Search ................ 257/734, 758, 773, 776, 257/401, 750

Primary Examiner—Mark V. Prenty

[57] ABSTRACT

A semiconductor integrated circuit device is provided which comprises circuit blocks driven at different power source voltages and voltage level converting circuits for converting the voltage level of a signal between these circuit blocks. Power source voltage supplying lines are disposed at an area corresponding to a wiring region provided between an internal circuit region and interface region formed on a semiconductor substrate, and a larger number of voltage level converting circuits than that necessary for the integrated circuit are disposed along the blocks are connected to the voltage level converting circuits of a necessary number for the integrated circuit. The time required for layout designing can be reduced and an error due to layout designing is difficult to be generated.

13 Claims, 3 Drawing Sheets

SEMICONDUCTOR INTEGRATED CIRCUIT DEVICE HAVING VOLTAGE LEVEL CONVERTING CIRCUITS

BACKGROUND OF THE INVENTION

1. Field of the Invention

This invention relates to a semiconductor integrated circuits device and more particularly, to a semiconductor integrated circuit device having voltage level converting circuits for converting the voltage level of a signal generated in one of circuit blocks driven at different power source voltages so as to meet the power source voltage of the other circuit block.

2. Description of the Prior Art

A layout example of a conventional semiconductor integrated circuit device having a voltage level containing circuit as shown above is shown in FIG. 1.

In FIG. 1, an interface region 2 is provided on a semiconductor substrate so as to surround an internal circuit block 1 and other internal circuit blocks (not shown), and a wiring region 3 is provided between these internal circuit blocks and the interface, region 2. The internal circuit block 1 is driven at a first power source voltage VI and has a macro-block 7 consisting of circuits driven at a second power source voltage V2.

The interface region 2 has interface blocks 2a disposed in a row and, in the wiring region 3 are disposed surrounding lines 4 and 5 for supplying the first source voltage V1. The surrounding line 4 is supplied with the first source voltage V1 from a first external power source (now shown) and the surrounding line 5 is connected to the earth. The circuits other than the macro-block 7 of the internal circuit block 1 are supplied with the first source voltage V1 through the surrounding lines 4 and 5.

The macro-block 7 has a surrounding line 7a for supplying the second power source voltage V2 to the internal circuits of the macro-block 7 and a voltage level converting circuit 7b for converting the voltage level between a signal generated in the internal circuit block 1 and a signal generated in the macro-block 7 in response to the first and second source voltages V1 and V2.

In the interface region 2 near the macro-block 7, interface blocks 9a and 9b for the second source voltage V2 are disposed which are connected to the surrounding line 7a, respectively, through wiring lines 8a and 8b disposed in the wiring region 3. The internal circuits of the macro-block 7, including the voltage level converting circuit 7b, are supplied with the second source voltage V2 through the interface blocks 9a and 9b, wiring lines 8a and 8b and surrounding wiring line 7a from a second external power source (not shown).

In the circuit layout shown in FIG. 1, the circuits driven by the second power source voltage V2 are collected in the block macro-7 together with the surrounding line 7a for supplying the power source voltage V2 thereto are and disposed within the internal circuit block 1 driven by the first power source voltage V1.

FIG. 2 shows another layout example of a conventional se miconductor integrated circuit device having a voltage level converting circuit.

In FIG. 2, an interface region 12 is provided so as to surround an internal circuit block 11 and other internal circuit blocks (not shown). The interface region 12 has interface blocks 12a and an interface block 17 in which a voltage level converting circuit 17b is disposed. In this example, the voltage level converting circuit 17b is not disposed in the macro-block 7 as in the preceding example but in the interface region 12.

The first power source voltage V1 is supplied through surrounding lines 14 and 15 disposed in a wiring region 13 to the internal circuit block 11 and other internal circuit blocks (not shown), and the second power source voltage V2 is supplied as shown in the example of FIG. 1. A signal of the circuit driven by the first source voltage V1 in the internal circuit block 11 and a signal of the circuit driven by the second source voltage V2 in the internal circuit block 11 are sent to the voltage level converting circuit 17b to be subjected to the voltage level conversion.

As mentioned above in, the layout of FIG. 2 the voltage level converting circuit 17b is provided in the interface region 12.

With the conventional devices as discussed above, the voltage level converting circuit is disposed in the macro-block or interface region and, as a result, if the layout of the integrated circuit is changed, the arrangement and wiring of the voltage level converting circuit are to be changed according. Thus, the integrated circuit itself is to be newly designed either entirely, or at least the macro-block is to be newly designed. As a result, there arises such a problem that not only it takes a lot of time for layout designing, but also the layout itself may contain to an error.

Particularly, in case that all internal circuit blocks are driven at the first power source voltage and all interface blocks are driven at the second power source voltage, a large number of voltage level converting circuits would be required and the above-mentioned problem will most apparently occur.

SUMMARY OF THE INVENTION

Thus, an object of this invention is to provide a semiconductor integrated circuit device in which the time required to design the layout of an integrated circuit including circuits driven at different power source voltages can be reduced and the occurrence of an error due to layout designing would be minimized.

A semiconductor integrated circuit device of this invention includes at least two circuit blocks driven at different power source voltages, and voltage level converting circuits for converting the voltage level of a signal between the circuit blocks. The semiconductor integrated circuit device comprises an internal circuit region containing a plurality of circuit blocks, an interface region containing a plurality of interface blocks, a wiring region formed between the internal circuit region and the interface region and containing lines for supplying power source voltages to at least one of the groups of the internal circuit blocks and interface blocks, and a number of voltage level converting circuits disposed along the lines for supplying power source voltage in an area corresponding to the wiring region. The signal lines of the circuit blocks are connected to the voltage level converting circuits of a necessary number for the integrated circuit device.

Here, "the area corresponding to the wiring region" means the area which is superposed on the wiring region upward or downward. The voltage level converting circuits are generally formed in a semiconductor substrate or near the surface thereof and as a result, the area corresponding to the wiring region becomes an area superposed on the wiring region on the substrate side.

The circuit blocks driven at different power source voltages may be or may not be collected in a macro-block.

The arrangement of the voltage level converting circuits is not limited specifically, so that it is sufficient if such circuits are arranged along the power source voltage supplying lines. However, it is preferable to arrange the voltage level converting circuits along those lines in an array form.

The lines for supplying power source voltages may be arranged in a loop form so as to surround the circuit blocks or may be arranged along a part of the periphery of the circuit blocks.

In the semiconductor integrated circuit device of this invention, a larger number of voltage level converting circuits than that necessary for the integrated circuit are provided, so that if the layout of an integrated circuit is changed, the voltage level converting circuits are selected and connected to the wiring lines according to the layout of the integrated circuit thus changed so as to accommodate the circuit change without changing the arrangement of the voltage level converting circuits. Consequently, there is no need to newly design the entire arrangement of the integrated circuit itself or the arrangement of macro-blocks, and as a result, not only can the time required for designing the layout be reduced but also an error due to layout designing will be minimized.

This effect is particularly significant when a large number of voltage level converting circuits are required.

The integration density of the device can be further improved by optimizing the layout of the voltage level converting circuits.

DESCRIPTION OF THE PREFERRED EMBODIMENTS

Preferred embodiments of this invention will be described below with reference to FIGS. 3 and 4.

Figure 1:
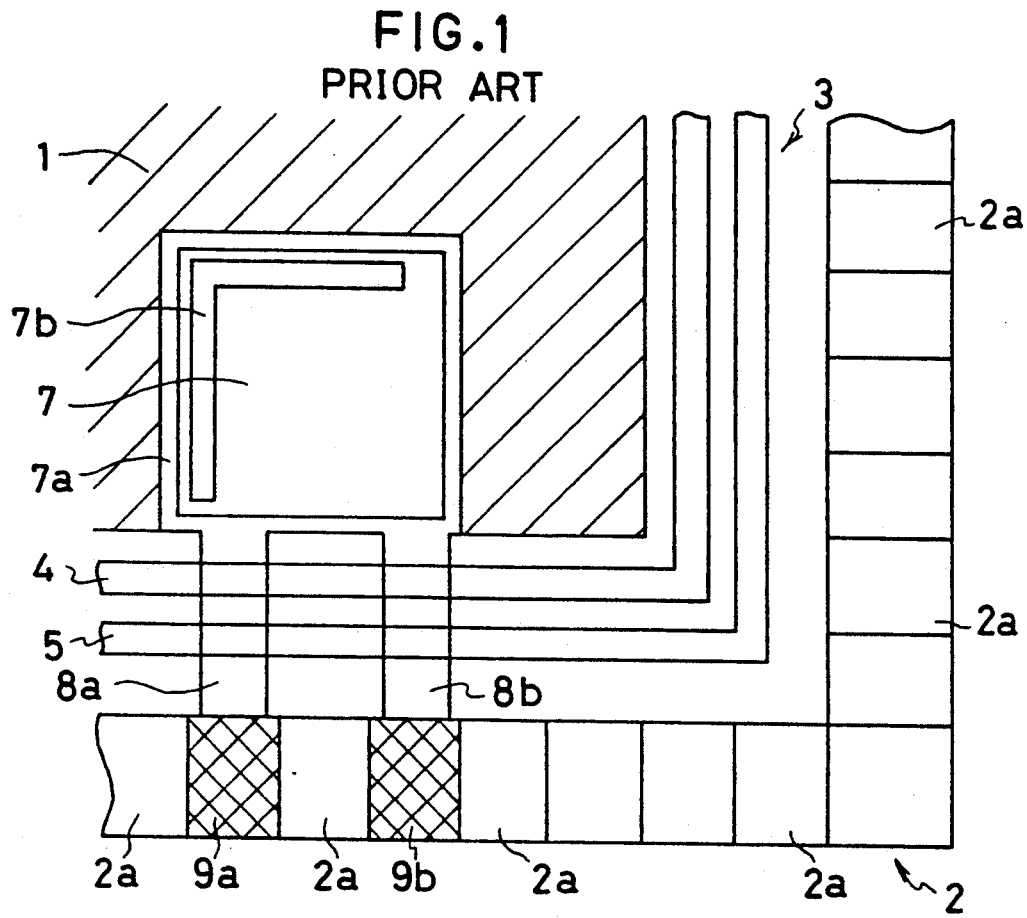
FIG. 1 is a partial circuit layout diagram showing an example of a conventional semiconductor integrated circuit device.
Figure 2:
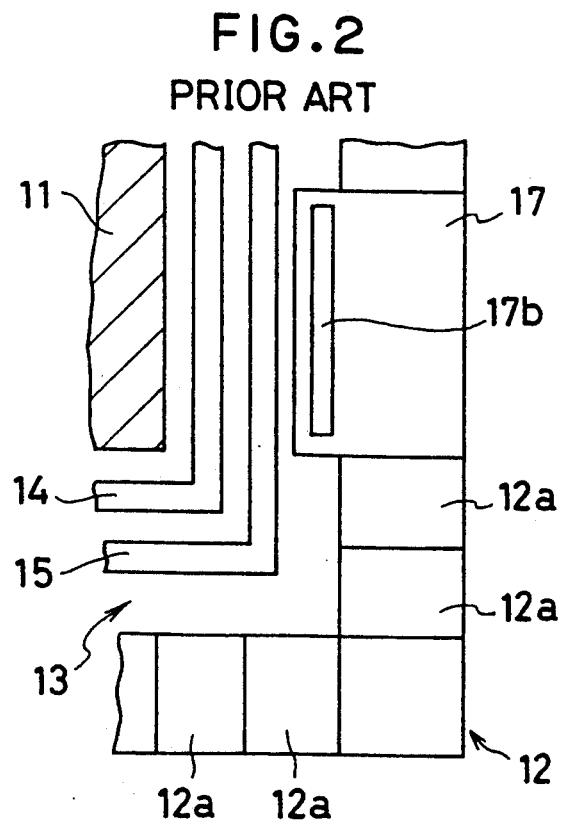
FIG. 2 is a partial circuit layout diagram showing another example of a conventional semiconductor integrated circuit device.
Figure 3:
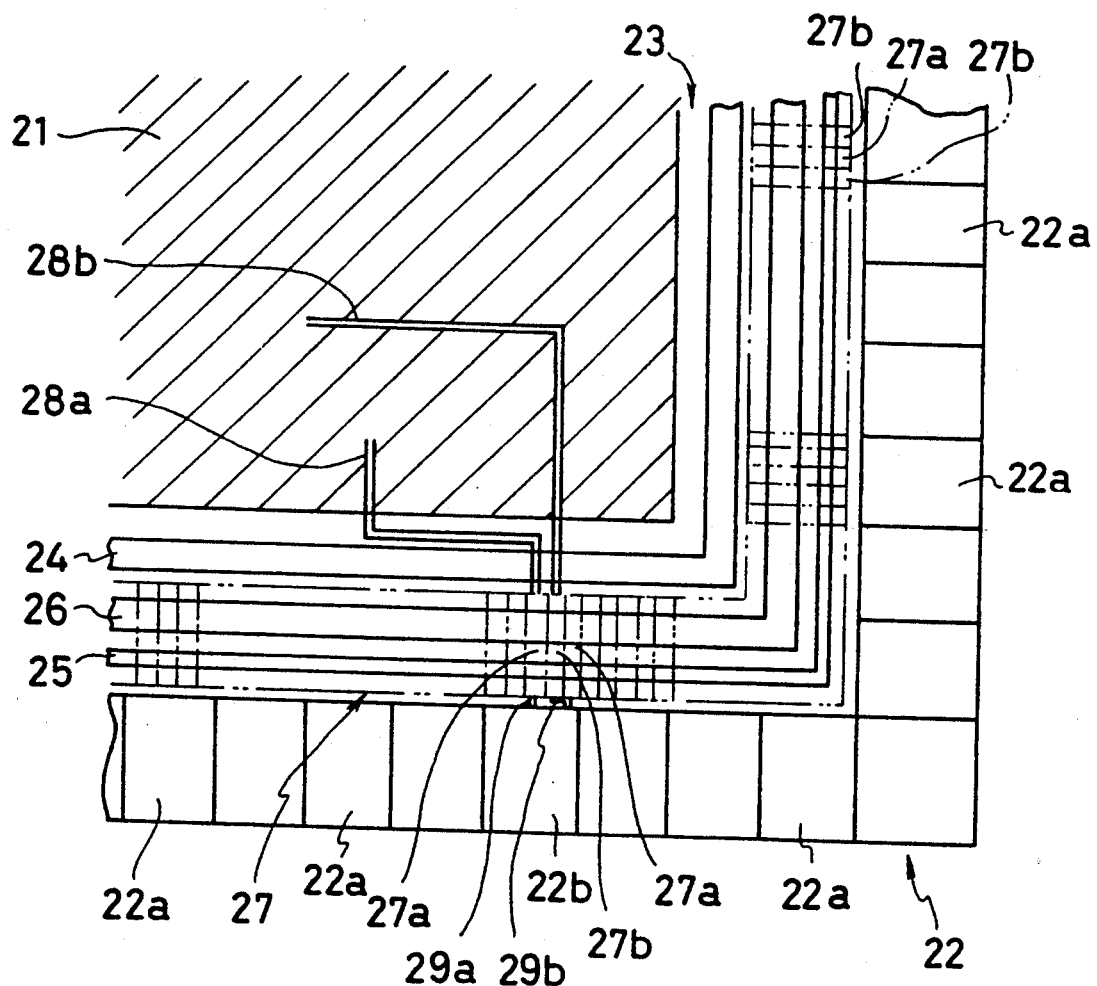
FIG. 3 is a partial circuit layout diagram of a semiconductor integrated circuit device according to a first embodiment of the invention.

FIG. 3 shows a semiconductor integrated circuit device according to a first embodiment of this invention. In FIG. 3, all internal circuit blocks including an internal circuit block 21 are driven at a first power source voltage VI (for example, 3 V) and all interface blocks are driven at a second power source voltage (for example, 5 V).

Namely, an interface region 22 is provided on a semiconductor substrate so as to surround the internal circuit block 21 and other internal circuit blocks (not shown). A wiring region 23 is provided on the semiconductor substrate between the circuit blocks and the interface region 22.

In the interface region 22, interface blocks 22a and 22b are disposed in a row. Signal lines 28a and 28b of the internal circuit block 21 are connected to the interface block 22b only, but not connected to the interface blocks 22a.

In the wiring region 23, three surrounding lines 24, 25 and 26 for supplying the power source voltage are so disposed that they entirely surround the internal circuit blocks. The innermost surrounding line 24 is supplied with the first source voltage V1 through a connecting wiring line (not shown) from a first external power source (not shown). The outermost surrounding line 25 is connected through a connecting wiring line (not shown) to the earth. The surrounding line 26 disposed between the lines 24 and 25 is supplied with the second source voltage V2 through a wiring line (not shown) from a second external power source (not shown).

The internal circuit block 21 and other circuit blocks (not shown) are supplied with the first source voltage V1 through the surrounding lines 24 and 25. The surrounding lines 26 and 25 serve to supply the second source voltage V2 respectively to the interface blocks 22a and 22b and voltage level converting circuits 27a and 27b.

In the wiring region 23, a plurality of pairs of the voltage level converting circuits 27a and 27b are disposed in parallel along the surrounding lines 25 and 26 and to entirely surround the internal circuit block 21 and the other internal circuit blocks (not shown). Each pair of the voltage level converting circuits 27a and 27b are patterned so as to be perpendicular respectively to the surrounding lines 25 and are 26, and disposed adjacently to each other in the same formation along the surrounding lines 25 and 26. More specifically, the voltage level converting circuits 27a and 27b are disposed alternatively along the surrounding lines 25 and 26. As a result, it can be seen that an "array" of the voltage level converting circuits 27a and 27b are disposed at the interface region 22. It is to be noted that the voltage level converting circuits 27a and 27b are not disposed at the corners of the interface region 22.

The voltage level converting circuit 27a converts the voltage level of a signal generated in the internal circuit block 21 driven at the first source voltage V1 to send the signal to the interface block 22b driven at the second source voltage V2. On the other hand, the voltage level converting circuit 27b converts the voltage level of a signal generated in the interface block 22a driven at the second source voltage V2 to send the signal to the internal circuit block 21 driven at the first source voltage V1.

The voltage level converting circuits 27a and 27b are connected through respective signal lines 28a and 28b to the internal circuit block 21 and through respective signal lines 29a and 29b to the interface block 22b. As a result, the signal generated in the internal circuit block 21 is sent through the signal line 28a to the voltage level converting circuit 27a to be subjected to voltage level conversion and sent through the signal line 29a to the interface block 22b. The signal generated in the interface block 22b is supplied through the signal line 29b to the voltage level converting circuit 27b to be subjected to the voltage level conversion and sent through the signal line 28b to the internal circuit block 21.

The signal level conversion between the other internal circuit blocks (not shown) and the interface blocks 22a can be achieved in the same way as shown through other signal lines (not shown).

The total number of the pairs of the voltage level converting circuits 27a and 27b is larger than that necessary for the integrated circuit device. That is, the voltage level converting circuits 27a and 27b are provided excessively in number on the semiconductor substrate, and only the necessary number of circuits are utilized.

In general, the voltage level converting circuits 27a and 27b are formed on the semiconductor substrate or near the surface of the substrate and the surrounding lines 24, 25 and 26 are disposed on respective insulators formed on the voltage level converting circuits 27a and 27b.

With the semiconductor integrated circuit device disclosed above, the number of pairs of the voltage level converting circuits 27a and 27b formed in advance in the wiring region 23 is greater than it is necessary for the integrated circuit so that the integrated circuits different in structure can be laid out without the need to lay out new voltage level converting circuit or circuits, and the voltage converting circuit 27a and 27b disposed at the optimal position in respect to the integrated circuit may be selected in pair and the wiring lines maybe connected respectively to the circuits. Accordingly, the time required for designing the layout of them can be reduced and at the same time, the occurrence of an error due to the labor and time required for the layout designing would be minimized.

In addition, all the internal circuit blocks are driven at the voltage of 3 V and all the interface blocks are driven at the voltage of 5 V, so that the power consumption of the semiconductor integrated circuit device can be reduced and by selecting an optimal arrangement of the voltage level converting circuits 27a and 27b, a high speed operation of the circuit can be realized.

Further, the semiconductor integrated circuit device according to the embodiment of FIG. 3 is advantageous in that a semiconductor substrate having a large number of the voltage level converting circuits 27a and 27b disposed thereon is prepared, then, a pair of the circuits are selected from the number of voltage level converting circuits 27a and 27b in accordance with the layout of the desired integrated circuit and the wiring lines are respectively connected to the circuits, resulting in an easily obtainable desired semiconductor integrated circuit device.

The semiconductor integrated circuit device of this invention is particularly suitable for a CMOS structure.

Figure 4:
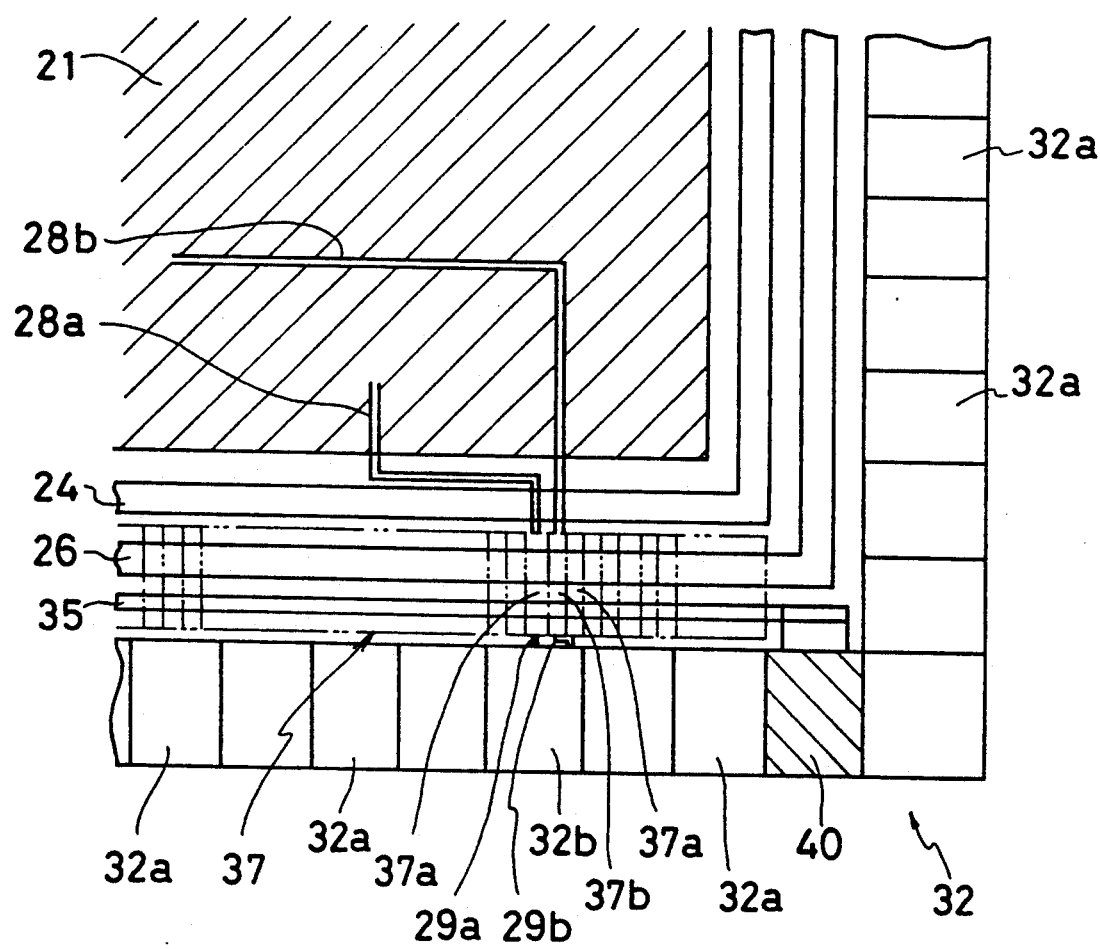
FIG. 4 is a partial circuit layout diagram of a semiconductor integrated circuit according to a second embodiment of the invention.

FIG. 4 shows a semiconductor integrated circuit device according to a second embodiment of the invention, which is similar in layout to the first embodiment excepting that an outermost signal line 35 in the wiring region 23 is not loop-shaped. The elements corresponding to those of the first embodiment are denoted with the same reference numerals and the explanation of those elements has been omitted.

In FIG. 4, an interface block 40 for supplying the second power source voltage V2 is disposed in an interface region 32. The signal or wiring line 35 is straight in shape and extends between the interface block 40 and another interface block (not shown) disposed symmetrically to the block 40. The signal line 35 is supplied with the second source voltage V2 through these two interface blocks. The surrounding lines 26 and 35 serve to supply the second source voltage V2, respectively, to the interface blocks 32a and 32b and the voltage level converting circuits 37a and 37b.

As mentioned above, the shape of the lines in the wiring region can be set arbitrarily.

In the first and second embodiments, the voltage level converting circuits 27a, 27b and 37a, 37b are adjacently disposed in pairs, but not necessary to dispose them in pair. For example, a plurality of voltage level converting circuits 27a and 37a may be adjacently disposed to make one group and on the other hand, a plurality of voltage level converting circuits 27b and 37b may be adjacently disposed to make another group and these two groups may be disposed alternatively along the surrounding lines 24, 25 and 26. In addition, the group of plural voltage level converting circuits 27b and 37b may be disposed at a distance from the position where the group of plural voltage level converting circuits 27a and 27b is disposed.

Further, in the embodiments, the voltage level converting circuits 27a, 27b and 37a, 37b are disposed respectively in the entire interface regions 22 and 32, respectively, but they are not limited thereto. Thus the voltage level converting circuits may be disposed at a position only as required from the viewpoint of an integrated circuit layout.

What is claimed is:

1. A semiconductor integrated circuit device comprising:
   an internal circuit region including a first circuit block and a second circuit block, said first circuit block being driven at a first power source voltage, and said second circuit block being driven at a second power source voltage different in value from said first power source voltage;
   an interface region including a plurality of interface blocks;
   a wiring region formed between said internal circuit region and said interface region, said wiring region including wiring lines;
   at least one first voltage level converting circuit configured for converting a signal voltage level between said first circuit block and said second circuit block, said first voltage level converting circuit being formed in said writing region; and
   at least one second voltage level converting circuit configured for converting a signal voltage level between said first circuit block and said second circuit block, said second voltage level converting circuit being formed in said wiring region;
   wherein only one of said first voltage level converting circuit and said second voltage level converting circuit is used for voltage conversion between said first circuit block and said second circuit block is a given semiconductor integrated circuit device arrangement.

2. The semiconductor integrated circuit device as claimed in claim 1, wherein said wiring lines are formed in a loop shape and each surrounds said first circuit block and said second circuit block, and wherein a plurality of said first voltage level converting circuits and a plurality of said second voltage level converting circuits are disposed along said looped wiring lines.

3. The semiconductor integrated circuit device as claimed in claim 1, wherein
   at least one of said wiring lines is formed without surrounding said first circuit block and said second circuit block, and remainder of said wiring lines are formed to surround said first circuit block and said second circuit block, and wherein
   a plurality of said first and second voltage level converting circuits are disposed along said at least one of said wiring lines.

4. The semiconductor integrated circuit device as claimed in claim 1, wherein said wiring lines include a first wiring line which is supplied with said first power source voltage, a second wiring line supplied with said second power source voltage, and a third line which is grounded.

5. The semiconductor integrated circuit device as claimed in claim 4, wherein
when said first voltage level converting circuit is supplied with said first power source voltage, said voltage is supplied through said first wiring line and said third wiring line, and
when said first voltage level converting circuit is supplied with said second power source voltage, said voltage is supplied through said second wiring line and said third wiring line.

6. The semiconductor integrated circuit device as claimed in claim 1, wherein a plurality of said first voltage level converting circuits and a plurality of said second voltage level converting circuits are arranged along said wiring lines in an array form.

7. A semiconductor integrated circuit device comprising a first circuit block formed in an internal circuit region and driven at a first power source voltage, a second circuit block formed in said internal circuit region and driven at a second power source voltage different in value from said first power source voltage, and voltage level converting circuits formed in a wiring region for converting a signal voltage level between said first and second circuit blocks, said voltage level converting circuits including a first voltage level converting circuit formed for converting a signal voltage level between said first circuit block and said second circuit block, a second voltage level converting circuit formed for converting a signal voltage level between said first circuit block and said second circuit block; wherein
only one of said first voltage level converting circuit and said second voltage level containing circuit is used for voltage conversion between said first circuit block and said second circuit block in a given semiconductor integrated circuit device arrangement.

8. A semiconductor integrated circuit device comprising:
an internal circuit region including a plurality of circuit blocks driven at a first power source voltage;
an interface region including a plurality of interface blocks, said interface blocks being driven at a second power source voltage different in value from said first power source voltage;
a wiring region formed between said internal circuit region and said interface region, said wiring region including wiring lines;
a first voltage level converting circuit configured for converting a signal voltage level between said circuit blocks and said interface blocks, said first voltage level converting circuit being formed in said wiring region; and
a second voltage level converting circuit configured for converting a signal voltage level between said circuit blocks and said interface blocks, said second voltage level converting circuit being formed in said wiring region;
wherein only one of said first voltage level converting circuit and said second voltage level converting circuit is used for voltage conversion between at least one of said circuit blocks and least one of said interface blocks in a given semiconductor integrated circuit device arrangement.

9. The semiconductor integrated circuit device as claimed in claim 8, wherein said wiring lines are of a loop-shape, and wherein a plurality of said first voltage level converting circuits and a plurality of said second voltage level converting circuits are disposed along said wiring lines.

10. The semiconductor integrated circuit device as claimed in claim 8, wherein
at least one of said wiring lines is formed without surrounding said at least one circuit block, and remainder of said wiring lines are formed to surround said at least one circuit block, and wherein
a plurality of said voltage level converting circuits are disposed along said at least one of said wiring lines.

11. The semiconductor integrated circuit device as claimed in claim 8, wherein said wiring lines include a first wiring line which is supplied with said first power source voltage, a second wiring line supplied with said second power source voltage, and a third line which is grounded.

12. The semiconductor integrated circuit device as claimed in claim 11, wherein
when said first voltage level converting circuit is supplied with said first power source voltage, said voltage is supplied through said first wiring line and said third wiring line, and
when said first voltage level converting circuit is supplied with said second power source voltage, said voltage is supplied through said second wiring line and said third wiring line.

13. The semiconductor integrated circuit device as claimed in claim 8, wherein a plurality of said first voltage level converting circuits and a plurality of said second voltage level converting circuits are arranged along said wiring lines in an array form.

* * * * *